(12) United States Patent
Tarng et al.

(10) Patent No.: US 11,255,705 B2
(45) Date of Patent: Feb. 22, 2022

(54) METHOD FOR SETTING QUALITY THRESHOLDS OF PRODUCTS FOR TESTING PURPOSES AND DEVICE EMPLOYING METHOD

(71) Applicant: HONGFUJIN PRECISION ELECTRONICS(TIANJIN)CO.,LTD., Tianjin (CN)

(72) Inventors: Wan-Hsin Tarng, New Taipei (TW); Han-Ting Hsu, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/908,949

(22) Filed: Jun. 23, 2020

(65) Prior Publication Data

US 2021/0131840 A1 May 6, 2021

(30) Foreign Application Priority Data

Nov. 5, 2019 (CN) .......................... 201911071806.9

(51) Int. Cl.
  *G01D 21/00* (2006.01)
(52) U.S. Cl.
  CPC .................................... *G01D 21/00* (2013.01)
(58) Field of Classification Search
  CPC ...................................................... G01D 21/00
  See application file for complete search history.

(56) References Cited

U.S. PATENT DOCUMENTS

| | | | |
|---|---|---|---|
| 6,738,450 B1 * | 5/2004 | Barford | G01N 23/044 378/58 |
| 8,106,946 B2 * | 1/2012 | Yan | H04N 5/33 348/126 |
| 2009/0243642 A1 * | 10/2009 | Tsai | G01R 31/2813 324/756.02 |

OTHER PUBLICATIONS

Zhongqiu Zhang et al., An Automatic Recognition Method for PCB Visual Defects, 2018, IEEE International Conference on Sensing, Diagnostics, Prognostics, and Control, pp. 138-142 (Year: 2018).*
Jianjie Ma, Defect Detection and Recognition of Bare PCB Based on Computer Vision, Jul. 26-28, 2017, IEEE Proceedings of the 36th Chinese Control Conference, pp. 11023-11028 (Year: 2017).*

* cited by examiner

*Primary Examiner* — Mischita L Henson
(74) *Attorney, Agent, or Firm* — ScienBiziP, P.C.

(57) ABSTRACT

A method for setting testing thresholds applied by a testing device to products being made includes obtaining an initial lower threshold for testing the products and counting, followed by manual review, first, second, third, and fourth type product qualities as being quantities under the initial lower threshold. The method adds a minimum product parameter of defective products, the initial lower threshold, and a number of values between the minimum product parameter and the initial lower threshold into a set, repeating the application of one selected element from the set as an experiment threshold. First to fourth type quantities of the current products are counted again under the experiment threshold, an effectiveness of each element of the set is calculated, and an element of the set with the maximum effectiveness is defined as a suggested lower threshold for testing the products.

12 Claims, 4 Drawing Sheets

METHOD FOR SETTING QUALITY THRESHOLDS OF PRODUCTS FOR TESTING PURPOSES AND DEVICE EMPLOYING METHOD

FIELD

The subject matter herein generally relates to quality control.

BACKGROUND

When making new products, it is necessary to gradually adjust a testing threshold to an appropriate range based on a large number of manual inspection results and status of the production line. In a traditional testing threshold method, engineers need to make adjustments several times to determine the final testing threshold for testing the products according to the test results of the production line, much time and cost is required for this.

Thus, there is room for improvement.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The connection can be such that the objects are permanently connected or releasably connected. The term "comprising," when utilized, means "including, but not necessarily limited to"; it specifically indicates open-ended inclusion or membership in the so-described combination, group, series, and the like.

Figure 1:
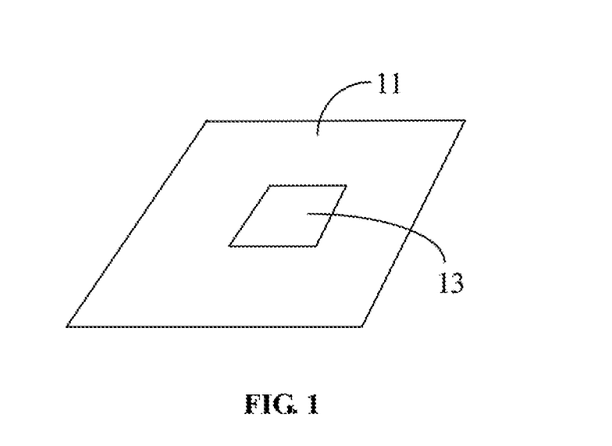
FIG. 1 is a diagram showing the testing environment of products in one embodiment.

FIG. 1 illustrates a test device 11 for testing a current product 13 accordance with an embodiment. The test device 11 can determine whether the current product 13 is a product of sufficient quality. The test device 11 can pre-store a testing standard and determine whether such standard or standards applied to the current product 13 meet the standard of quality required. Then the test device 11 can determine the current product 13 as being good or as being defective. For example, the test device 11 can be an automated optical inspection (AOI) machine, the current product 13 is a printed circuit board (PCB), and the standards relating to the current product 13 can comprise assembly status of each component of the PCB, solder paste printing status, etc. Each product parameter applied to the PCB can correspond to a threshold range. If measured values and qualities of the PCB are all within the corresponding threshold ranges, the test device 11 can determine the PCB as a good product. If one or more measured values and qualities of the PCB are not within the corresponding threshold ranges, the test device 11 can determine the PCB as a defective product.

In one embodiment, when several current products 13 detected by the test device 11 are manually re-inspected, the re-inspection result can comprise four situations, that is, the quantity of the current products 13 determined as good products by the test device 11 and also having a favorable manual review (hereinafter "first type quantity"). The first type quantity of the current products is defined as TN. The quantity of the current products 13 determined as good products by the test device 11 but defined as defective products by the manual review ("second type quantity"). The second type quantity of the current products 13 is defined as FN. The quantity of the current products 13 determined as defective products by the test device 11 but defined as good by the manual review ("third type quantity"). The third type quantity of the current products 13 is defined as FP. The quantity of the current products 13 determined as defective by the test device 11, and also determined as defective by the manual review ("fourth type quantity"). The fourth type quantity of the current products 13 is defined as TP.

Figure 2:
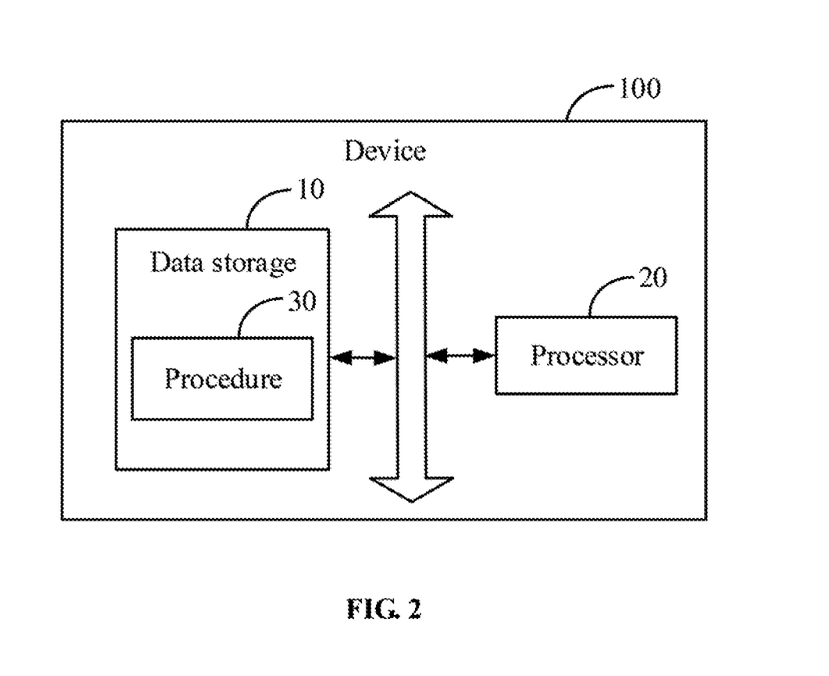
FIG. 2 is a block diagram of an embodiment of a device for setting a testing threshold of the products of FIG. 1.

FIG. 2 illustrates a device 100 for setting a testing threshold of the current products 13 in accordance with an embodiment.

In one embodiment, the device 100 can comprise at least one data storage 10, at least one processor 20, and a procedure 30 for setting the testing threshold of the current products 13. For example, the device 100 can be a computer or a server. The device 100 can further comprise a display device, a network access device, and communication buses.

In one embodiment, the data storage 10 can be in the device 100, or can be a separate external memory card, such as an SM card (Smart Media Card), an SD card (Secure Digital Card), or the like. The data storage 10 can include various types of non-transitory computer-readable storage mediums. For example, the data storage 10 can be an internal storage system, such as a flash memory, a random access memory (RAM) for temporary storage of information, and/or a read-only memory (ROM) for permanent storage of information. The data storage 10 can also be an external storage system, such as a hard disk, a storage card, or a data storage medium. The processor 20 can be a central processing unit (CPU), a microprocessor, or other data processor chip that performs functions of the device 100.

In one embodiment, the device 100 can also be integrated into the test device 11.

Figure 3:
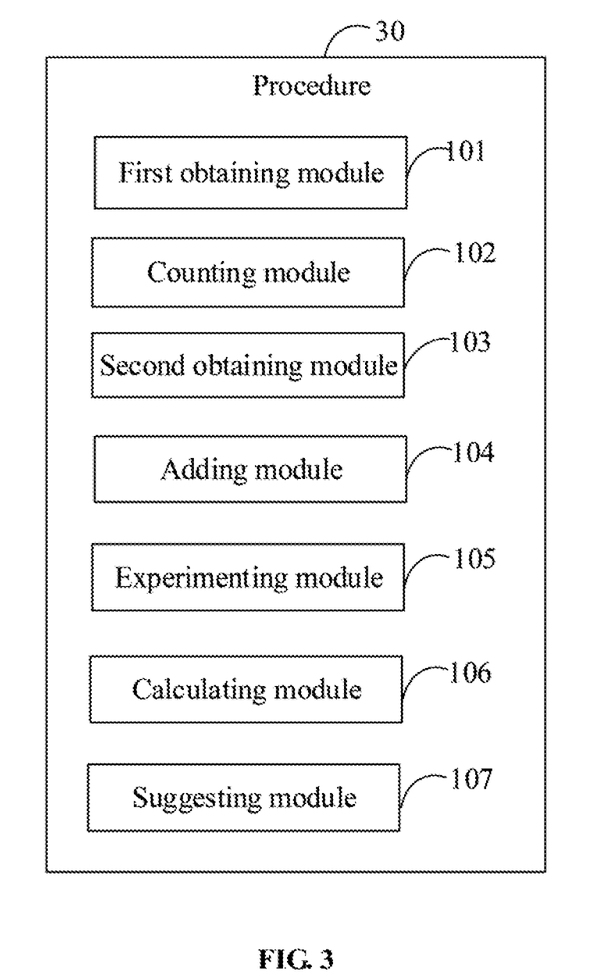
FIG. 3 is a block diagram of an embodiment of a procedure for setting a testing threshold of the products of FIG. 2.

FIG. 3 illustrates the procedure 30 as comprising a plurality of modules, such as a first obtaining module 101, a counting module 102, a second obtaining module 103, an adding module 104, an experimenting module 105, a calculating module 106, and a suggesting module 107. The modules 101-107 may comprise one or more software programs in the form of computerized codes stored in the data storage 10. The computerized codes may include instructions that can be executed by the processor 20 to provide functions for the modules 101-107.

The first obtaining module 101 obtains an initial testing threshold and a set mode of the initial testing threshold set by the test device 11 for testing the current products 13.

In one embodiment, the initial testing threshold can be a testing threshold set by a user in the test device 11 according to the previous testing experience of the user. When the initial testing threshold is set, the first obtaining module 101 can acquire the initial testing threshold of the test device 11 set by the user. The set mode of the initial testing threshold can comprise three situations. First, a mode only to set an initial lower threshold LSL ("first set mode"), the initial testing threshold being expressed as [LSL, ∞]. Second, a mode to set an initial upper threshold USL ("second set mode"), the initial testing upper threshold being expressed as [0, USL]. Third, a mode to set both the initial lower threshold LSL and the initial upper threshold USL, such initial testing threshold is expressed as [LSL, USL].

The following description uses the first set mode as an example. In other words, the initial testing threshold is [LSL, ∞].

The counting module 102 counts a first type quantity of the current products 13, a second type quantity of the current products 13, a third type quantity of the current products 13, and a fourth type quantity of the current products 13 when the current products 13 are tested under the initial testing threshold.

In one embodiment, each of the current products 13 needs manual reviewing. The first type quantity of the current products 13, the second type quantity of the current products 13, the third type quantity of the current products 13, and the fourth type quantity of the current products 13 can be counted by a tester, and the tester can input the test data into the test device 11, and then the counting module 102 can obtain the first type quantity of the current products 13, the second type quantity of the current products 13, the third type quantity of the current products 13, and the fourth type quantity of the current products 13 under the initial testing threshold.

The second obtaining module 103 obtains a minimum product parameter from defective products determined by the test device 11.

In one exemplary embodiment, the initial lower threshold LSL being set as an example, a measurement range determined by the test device 11 as a defective product is [0, LSL], and a measurement range determined by the test device 11 as a good product is [LSL, ∞]. In actual production, the production environment and processing parameters are not in an ideal production state, and the test device 11 may detect multiple defective products. A measurement range of the product parameters of the multiple defective products is between [0, LSL]. The second obtaining module 103 can obtain the minimum product parameter from the multiple defective products.

For example, the measurement range determined by the test device 11 as a defective product is [0, 10 mm], the test device 11 may detect six defective products, the actual particular quality of the six defective products comprising 5 mm, 6 mm, 5 mm, 8 mm, 9 mm, and 7 mm. Then the minimum product parameter of the six defective products obtained by the second obtaining module 103 is 5 mm.

The adding module 104 adds the minimum product parameter, the initial lower threshold, and a number of values between the minimum product parameter and the initial lower threshold into a first set.

In one embodiment, the number of values may be integer values between the minimum product parameter and the initial lower threshold. The number of values may also form an arithmetic sequence with the initial lower threshold or the minimum product parameter. The difference of the arithmetic sequence can be set according to a practical application. When the minimum product parameter, the initial lower threshold, and the number of values between the minimum product parameter and the initial lower threshold are added into the first set, the first set comprises a plurality of elements.

The experimenting module 105 selects an element from the first set as a first experiment threshold and counts a first type quantity of the current products 13, a second type quantity of the current products 13, a third type quantity of the current products 13, and a fourth type quantity of the current products 13 under the first experiment threshold.

In one embodiment, the experimenting module 105 can repeat one element from the first set and set that as the first experiment threshold until the first set becomes an empty set. Then the experimenting module 105 can count the first type quantity, the second type quantity, the third type quantity, and the fourth type quantity of each element of the first set.

The calculating module 106 calculates an effectiveness of the first experiment threshold according to the first type quantity of the current products 13 under the initial lower threshold, the third type quantity of the current products 13 under the initial lower threshold, the first type quantity of the current products 13 under the first experiment threshold, and the third type quantity of the current products 13 under the first experiment threshold.

In one embodiment, when the experimenting module 105 counts the first type quantity, the second type quantity, the third type quantity, and the fourth type quantity under the first experiment threshold, the calculating module 106 can calculate the effectiveness of the first experiment threshold according to the first type quantity and the third type quantity under the initial lower threshold, and the first type quantity and the third type quantity under the first experiment threshold. Each element of the first set can be defined as the first experiment threshold, and the calculation module 106 can calculate the effectiveness of each element of the first set through the above-described calculation method.

In one embodiment, a formula for calculating the effectiveness of the first experiment threshold can be set according to a practical application. For example, the formula for calculating the effectiveness of the first experiment threshold is $BF=(TN'-TN)*COST1-(FN'-FN)*COST2$, where BF represents the effectiveness of the first experiment threshold, TN' represents the first type quantity of the current products 13 under the first experiment threshold, TN represents the first type quantity of the current products 13 under the initial lower threshold, FN' represents the third type quantity of the current products 13 under the first experiment threshold, and FN represents the third type quantity of the current products under the initial lower threshold. COST1 represents a cost of the test device 11 to determine good products as defective products, and COST2 represents a cost of the test device 11 to determine defective products as good products.

The suggesting module 107 defines an element of the first set with a maximum effectiveness as a suggested lower threshold for testing the current products 13.

In one embodiment, if the first set comprises a plurality of elements with the maximum effectiveness, the suggesting module 107 can further select an element from the plurality of elements that is closest to the initial lower threshold as the suggested lower threshold. The suggested lower threshold is configured for testing product parameters of the current products 13.

In one embodiment, if the first set comprises the plurality of elements with the maximum effectiveness, the suggesting module 107 calculates a difference between each of the plurality of elements and the initial lower threshold, and selects an objective element from the plurality of elements which has a minimum difference with respect to the initial lower threshold. The suggesting module 107 defines the objective element as the suggested lower threshold for testing the current products 13.

In one embodiment, if the set mode of the initial testing threshold is an upper threshold mode, the initial testing threshold comprises is the initial upper threshold USL. A measurement range determined by the test device 11 as a defective product is [USL, ∞], and a measurement range determined by the test device 11 as a good product is [0, USL]. The test device 11 may detect multiple defective products. A measurement range of the product parameters of the multiple defective products is between [USL, ∞]. The second obtaining module 103 can obtain the maximum product parameter from the multiple defective products.

For example, the measurement range determined by the test device 11 as indicating a defective product is [10 mm, ∞], and the test device 11 may detect six defective products. The product parameters of the six defective products may comprise 15 mm, 16 mm, 15 mm, 18 mm, 19 mm, and 17 mm. Then the maximum product parameter of the six defective products obtained by the second obtaining module 103 is 19 mm.

In one embodiment, the adding module 104 can add the maximum product parameter, the initial upper threshold, and a number of values between the maximum product parameter and the initial upper threshold into a second set. The number of values may be integer values between the maximum product parameter and the initial upper threshold. The number of values may also form an arithmetic sequence with the initial upper threshold or the maximum product parameter. The difference of the arithmetic sequence can also be set according to a practical application. When the maximum product parameter, the initial upper threshold, and the number of values between the maximum product parameter and the initial upper threshold are added into the second set, the second set comprises a plurality of elements.

In one embodiment, the experimenting module 105 can apply an element selected from the second set as a second experiment threshold and count a first type quantity of the current products 13, a second type quantity of the current products 13, a third type quantity of the current products 13, and a fourth type quantity of the current products 13 under the second experiment threshold.

In one embodiment, the experimenting module 105 can repeat one element from the second set and set that as the second experiment threshold until the second set becomes an empty set. Then the experimenting module 105 can count the first type quantity, the second type quantity, the third type quantity, and the fourth type quantity of each element of the second set. The calculating module 106 can calculate an effectiveness of the second experiment threshold according to the first type quantity of the current products 13 under the initial upper threshold, the third type quantity of the current products 13 under the initial upper threshold, the first type quantity of the current products 13 under the second experiment threshold, and the third type quantity of the current products 13 under the second experiment threshold.

In one embodiment, when the experimenting module 105 counts the first type quantity, the second type quantity, the third type quantity, and the fourth type quantity under the second experiment threshold, the calculating module 106 can calculate the effectiveness of the second experiment threshold according to the first type quantity and the third type quantity under the initial upper threshold, and the first type quantity and the third type quantity under the second experiment threshold. Each element of the second set can be defined as the second experiment threshold, and the calculation module 106 can calculate the effectiveness of each element of the second set through the above-described calculation method.

In one embodiment, the suggesting module 107 can define an element of the second set with a maximum effectiveness as a suggested upper threshold for testing the current products 13. If the second set comprises a plurality of elements with the maximum effectiveness, the suggesting module 107 can further select an element from the plurality of elements that is closest to the initial upper threshold as the suggested upper threshold.

In one embodiment, if the second set comprises the plurality of elements with the maximum effectiveness, the suggesting module 107 can calculate a difference between each of the plurality of elements and the initial upper threshold, and select an objective element from the plurality of elements which has a minimum difference with respect to the initial upper threshold. The suggesting module 107 defines the objective element as the suggested upper threshold for testing the current products 13.

In one embodiment, if the set mode of the initial testing threshold is to set both the initial lower threshold LSL and the initial upper threshold USL, the initial testing threshold can be expressed as [LSL, USL]. A measurement range of a defective product determined by the test device 11 is [0, USL] and [USL, ∞], and a measurement range of a good product as determined by the test device 11 is [LSL, USL]. Based on the above-described method for determining the suggested lower threshold, the suggested lower threshold for testing the current products 13 by the test device 11 can be determined by analyzing the defective products in the [0, USL]. Based on the above described method for determining the suggested upper threshold, the suggested upper threshold for testing the current products 13 by the test device 11 can be determined by analyzing the defective products in the [USL, ∞].

Figure 4:
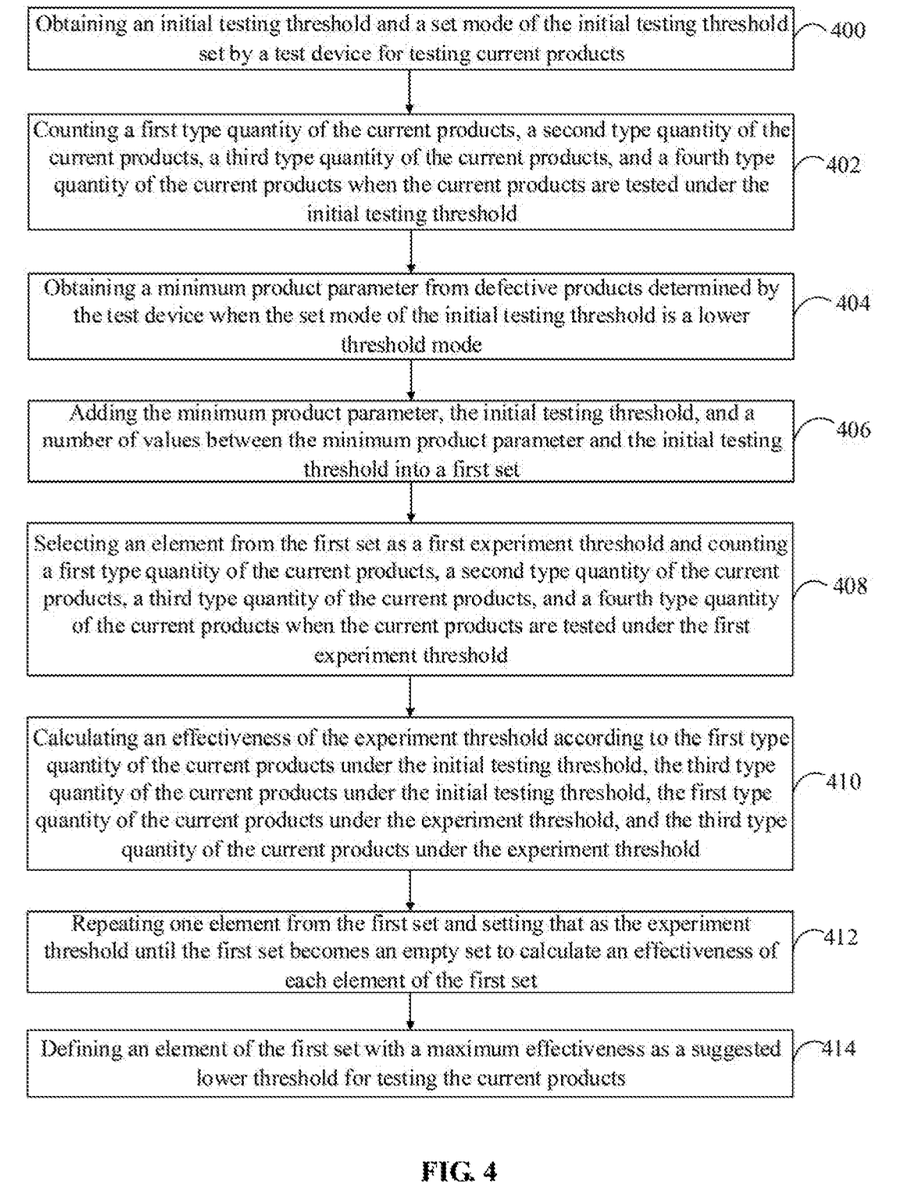
FIG. 4 is a flow diagram of an embodiment of a method for setting a testing threshold of the products utilized in the device of FIG. 2.

FIG. 4 illustrates one exemplary embodiment of a method for setting a testing threshold of products. The flowchart presents an exemplary embodiment of the method. The exemplary method is provided by way of example, as there are a variety of ways to carry out the method. The method described below can be carried out using the configurations illustrated in FIG. 3, for example, and various elements of these figures are referenced in explaining the example method. Each block shown in FIG. 4 may represent one or more processes, methods, or subroutines, carried out in the example method. Furthermore, the illustrated order of blocks is illustrative only and the order of the blocks can change. Additional blocks can be added or fewer blocks may be utilized, without departing from this disclosure. The example method can begin at block 400.

In block 400, an initial testing threshold and a set mode of the initial testing threshold set by the test device 11 for testing the current products 13 are obtained.

In block 402, a first type quantity of the current products 13, a second type quantity of the current products 13, a third type quantity of the current products 13, and a fourth type quantity of the current products 13 are counted when the current products 13 are tested under the initial testing threshold.

In block 404, a minimum product parameter from defective products determined by the test device 11 is obtained when the set mode of the initial testing threshold is a lower threshold mode.

In block 406, the minimum product parameter, the initial testing threshold, and a number of values between the minimum product parameter and the initial testing threshold are added into a first set.

In block 408, an element is selected from the first set as a first experiment threshold and a first type quantity of the current products 13, a second type quantity of the current products 13, a third type quantity of the current products 13, and a fourth type quantity of the current products 13 are counted when the current products 13 are tested under the first experiment threshold.

In block 410, an effectiveness of the first experiment threshold is calculated according to the first type quantity of the current products 13 under the initial testing threshold, the third type quantity of the current products 13 under the initial testing threshold, the first type quantity of the current products 13 under the first experiment threshold, and the third type quantity of the current products 13 under the first experiment threshold.

In block 412, one element from the first set is repeated and set that as the first experiment threshold until the first set becomes an empty set to calculate an effectiveness of each element of the first set.

In block 414, an element of the first set with a maximum effectiveness is defined as a suggested lower threshold for testing the current products 13.

Figure 5:
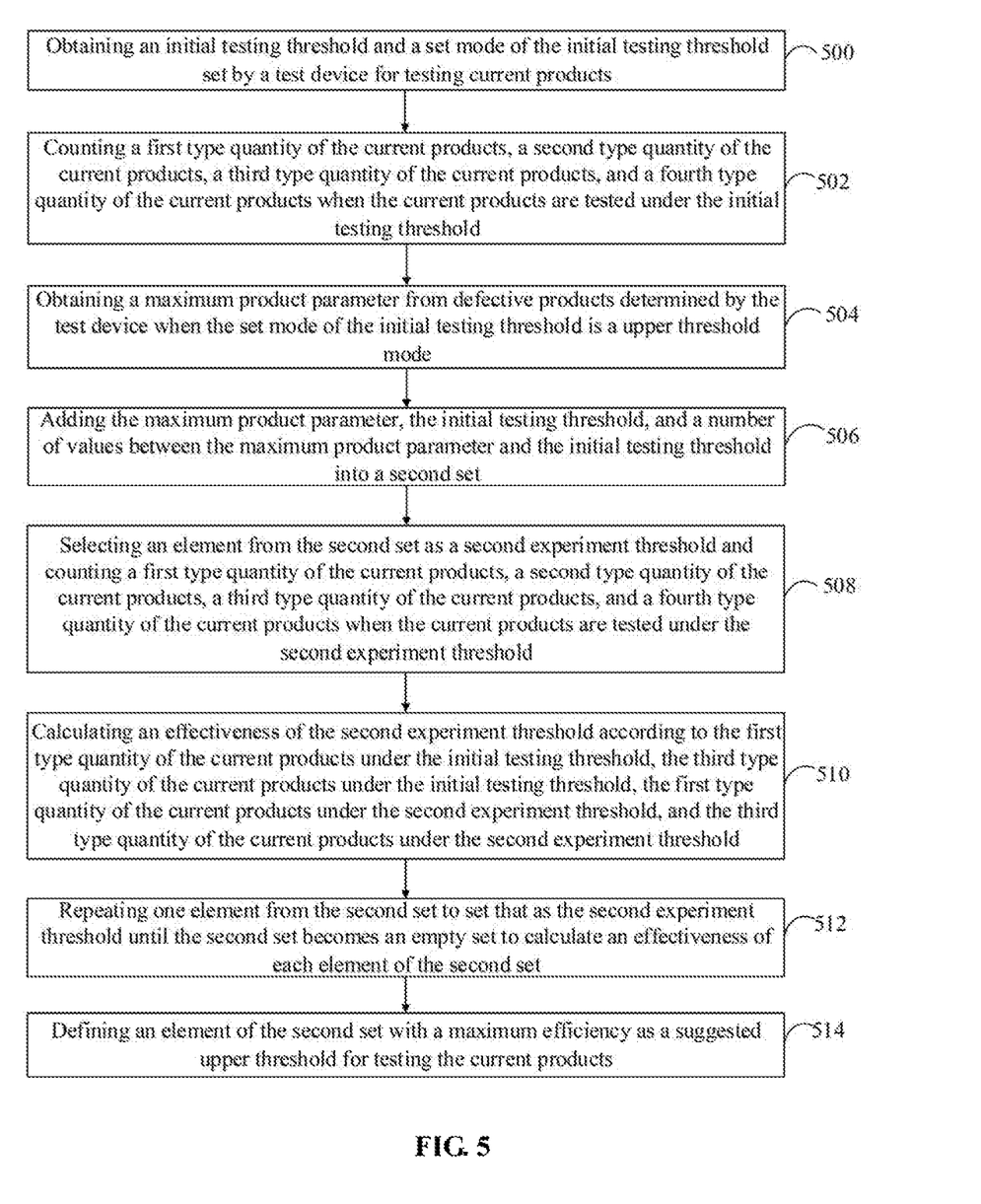
FIG. 5 is a flow diagram of another embodiment of a method for setting a testing threshold of the products which is utilized in the device of FIG. 2.

FIG. 5 illustrates one exemplary embodiment of a method for setting a testing threshold of products. The flowchart presents an exemplary embodiment of the method. The exemplary method is provided by way of example, as there are a variety of ways to carry out the method. The method described below can be carried out using the configurations illustrated in FIG. 3, for example, and various elements of these figures are referenced in explaining the example method. Each block shown in FIG. 5 may represent one or more processes, methods, or subroutines, carried out in the example method. Furthermore, the illustrated order of blocks is illustrative only and the order of the blocks can change. Additional blocks can be added or fewer blocks may be utilized, without departing from this disclosure. The example method can begin at block 500.

In block 500, an initial testing threshold and a set mode of the initial testing threshold set by the test device 11 for testing the current products 13 are obtained.

In block 502, a first type quantity of the current products 13, a second type quantity of the current products 13, a third type quantity of the current products 13, and a fourth type quantity of the current products 13 are counted when the current products 13 are tested under the initial testing threshold.

In block 504, a maximum product parameter from defective products determined by the test device 11 is obtained when the set mode of the initial testing threshold is an upper threshold mode.

In block 506, the maximum product parameter, the initial testing threshold, and a number of values between the maximum product parameter and the initial testing threshold are added into a second set.

In block 508, an element is selected from the second set as a second experiment threshold and a first type quantity of the current products 13, a second type quantity of the current products 13, a third type quantity of the current products 13, and a fourth type quantity of the current products 13 are counted when the current products 13 are tested under the second experiment threshold.

In block 510, an effectiveness of the second experiment threshold is calculated according to the first type quantity of the current products 13 under the initial testing threshold, the third type quantity of the current products 13 under the initial testing threshold, the first type quantity of the current products 13 under the second experiment threshold, and the third type quantity of the current products 13 under the second experiment threshold.

In block 512, one element from the second set is repeated and set that as the second experiment threshold until the second set becomes an empty set to calculate an effectiveness of each element of the second set.

In block 514, an element of the second set with a maximum effectiveness is defined as a suggested upper threshold for testing the current products 13.

The embodiments shown and described above are only examples. Many details known in the field are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for setting a testing threshold of products implemented in a device, the device comprising a processor and a test device, the method comprising:

obtaining, by the processor, an initial testing threshold and a set mode of the initial testing threshold set by the test device for testing current products, wherein the processor is communicated with the test device;

obtaining, by the processor, a first type quantity of the current products, a second type quantity of the current products, a third type quantity of the current products, and a fourth type quantity of the current products counted by the test device when the current products are tested under the initial testing threshold;

obtaining, by the processor, a minimum product parameter from defective products determined by the test device when the set mode of the initial testing threshold is a lower threshold mode;

adding, by the processor, the minimum product parameter, the initial testing threshold, and a number of values between the minimum product parameter and the initial testing threshold into a first set;

selecting, by the processor, an element from the first set as an experiment threshold and obtaining, by the processor, a first type quantity of the current products, a second type quantity of the current products, a third type quantity of the current products, and a fourth type quantity of the current products counted by the test device when the current products are tested under the experiment threshold;

calculating, by the processor, an effectiveness of the experiment threshold according to the first type quantity of the current products under the initial testing threshold, the third type quantity of the current products under the initial testing threshold, the first type quantity of the current products under the experiment threshold, and the third type quantity of the current products under the experiment threshold;

repeating one element from the first set and setting that as the experiment threshold until the first set becomes an empty set to calculate an effectiveness of each element of the first set by the processor; and defining, by the processor, an element of the first set with a maximum effectiveness as a suggested lower threshold of the test device for testing the current products;

wherein when the first set comprises a plurality of elements with the maximum effectiveness, the processor calculates a difference between each of the plurality of elements and the initial testing threshold, selects an objective element from the plurality of elements which has a minimum difference with respect to the initial testing threshold, and defines the objective element as the suggested lower threshold of the test device for testing the current products;

wherein the first type quantity of the current products is the quantity determined as good products by the test device, and a manual review is also good products; the second type quantity of the current products is the quantity determined as good products by the test device, and a manual review is defective products; the third type quantity of the current products is the quantity determined as defective products by the test device, and a manual review is good products; the fourth type quantity of the current products is the quantity determined as defective products by the test device, and a manual review is also defective products.

2. The method of claim 1, further comprising:
obtaining, by the processor, a maximum product parameter from defective products determined by the test device when the set mode of the initial testing threshold is an upper threshold mode;
adding, by the processor, the maximum product parameter, the initial testing threshold, and a number of values between the maximum product parameter and the initial testing threshold into a second set; and
defining, by the processor, an element of the second set with a maximum effectiveness as a suggested upper threshold of the test device for testing the current products.

3. The method of claim 2, wherein the method of defining the element of the second set with the maximum effectiveness as the suggested upper threshold of the test device for testing the current products comprises:
calculating a difference between each of a plurality of elements and the initial testing threshold when the second set comprises the plurality of elements with the maximum effectiveness;
selecting an objective element from the plurality of elements which has a minimum difference with respect to the initial testing threshold; and
defining the objective element as the suggested upper threshold of the test device for testing the current products.

4. The method of claim 1, wherein the effectiveness of the experiment threshold is calculated by a formula of: $BF=(TN'-TN)*COST1-(FN'-FN)*COST2$;
wherein BF represents the effectiveness of the experiment threshold, $TN'$ represents the first type quantity of the current products under the experiment threshold, TN represents the first type quantity of the current products under the initial testing threshold, $FN'$ represents the third type quantity of the current products under the experiment threshold, FN represents the third type quantity of the current products under the initial testing threshold, COST1 represents a cost of the test device to determine good products as defective products, and COST2 represents a cost of the test device to determine defective products as good products.

5. A method for setting a testing threshold of products implemented in a device, the device comprising a processor and a test device, the method comprising:
obtaining, by the processor, an initial lower threshold and an initial upper threshold set by the test device for testing current products, wherein the processor is communicated with the test device;
obtaining, by the processor, a first type quantity of the current products, a second type quantity of the current products, a third type quantity of the current products, and a fourth type quantity of the current products counted by the test device when the current products are tested under the initial lower threshold;
obtaining, by the processor, a minimum product parameter from defective products determined by the test device under the initial lower threshold;
adding, by the processor, the minimum product parameter, the initial lower threshold, and a number of values between the minimum product parameter and the initial lower threshold into a first set;
selecting, by the processor, an element from the first set as a first experiment threshold and counting a first type quantity of the current products, a second type quantity of the current products, a third type quantity of the current products, and a fourth type quantity of the current products counted by the test device when the current products are tested under the first experiment threshold;
calculating, by the processor, an effectiveness of the first experiment threshold according to the first type quantity of the current products under the initial lower threshold, the third type quantity of the current products under the initial lower threshold, the first type quantity of the current products under the first experiment threshold, and the third type quantity of the current products under the first experiment threshold;
repeating one element from the first set and setting that as the first experiment threshold until the first set becomes an empty set to calculate an effectiveness of each element of the first set by the processor;
defining, by the processor, an element of the first set with a maximum effectiveness as a suggested lower threshold of the test device for testing the current products;
obtaining, by the processor, a first type quantity of the current products, a second type quantity of the current products, a third type quantity of the current products, and a fourth type quantity of the current products counted by the test device when the current products are tested under the initial upper threshold;

obtaining, by the processor, a maximum product parameter from defective products determined by the test device under the initial upper threshold;

adding, by the processor, the maximum product parameter, the initial upper threshold, and a number of values between the maximum product parameter and the initial upper threshold into a second set;

selecting, by the processor, an element from the second set as a second experiment threshold and counting a first type quantity of the current products, a second type quantity of the current products, a third type quantity of the current products, and a fourth type quantity of the current products counted by the test device when the current products are tested under the second experiment threshold;

calculating, by the processor, an effectiveness of the second experiment threshold according to the first type quantity of the current products under the initial upper threshold, the third type quantity of the current products under the initial upper threshold, the first type quantity of the current products under the second experiment threshold, and the third type quantity of the current products under the second experiment threshold;

repeating one element from the second set and setting that as the second experiment threshold until the second set becomes an empty set to calculate an effectiveness of each element of the second set by the processor; and defining, by the processor, an element of the second set with a maximum effectiveness as a suggested upper threshold of the test device for testing the current products;

wherein when the first set comprises a plurality of elements with the maximum effectiveness, the processor calculates a difference between each of the plurality of elements and the initial lower threshold, selects an objective element from the plurality of elements which has a minimum difference with respect to the initial lower threshold, and defines the objective element as the suggested lower threshold of the test device for testing the current products;

wherein the first type quantity of the current products is the quantity determined as good products by the test device, and a manual review is also good products; the second type quantity of the current products is the quantity determined as good products by the test device, and a manual review is defective products; the third type quantity of the current products is the quantity determined as defective products by the test device, and a manual review is good products; the fourth type quantity of the current products is the quantity determined as defective products by the test device, and a manual review is also defective products.

6. The method of claim 5, wherein the method of defining the element of the second set with the maximum effectiveness as the suggested upper threshold of the test device for testing the current products comprises:

calculating a difference between each of a plurality of elements and the initial upper threshold when the second set comprises the plurality of elements with the maximum effectiveness;

selecting an objective element from the plurality of elements which has a minimum difference with respect to the initial upper threshold; and defining the objective element as the suggested upper threshold of the test device for testing the current products.

7. A device for setting a testing threshold of products, the device comprising:

a test device;

at least one processor communicated with the test device; and a storage device storing one or more programs which when executed by the at least one processor, cause the at least one processor to:

obtain an initial testing threshold and a set mode of the initial testing threshold set by the test device for testing current products;

obtain a first type quantity of the current products, a second type quantity of the current products, a third type quantity of the current products, and a fourth type quantity of the current products counted by the test device when the current products are tested under the initial testing threshold;

obtain a minimum product parameter from defective products determined by the test device when the set mode of the initial testing threshold is a lower threshold mode;

add the minimum product parameter, the initial testing threshold, and a number of values between the minimum product parameter and the initial testing threshold into a first set;

select an element from the first set as an experiment threshold and obtain a first type quantity of the current products, a second type quantity of the current products, a third type quantity of the current products, and a fourth type quantity of the current products counted by the test device when the current products are tested under the experiment threshold;

calculate an effectiveness of the experiment threshold according to the first type quantity of the current products under the initial testing threshold, the third type quantity of the current products under the initial testing threshold, the first type quantity of the current products under the experiment threshold, and the third type quantity of the current products under the experiment threshold;

repeat one element from the first set and setting that as the experiment threshold until the first set becomes an empty set to calculate an effectiveness of each element of the first set; and define an element of the first set with a maximum effectiveness as a suggested lower threshold of the test device for testing the current products;

wherein when the first set comprises a plurality of elements with the maximum effectiveness, the processor calculates a difference between each of the plurality of elements and the initial testing threshold, selects an objective element from the plurality of elements which has a minimum difference with respect to the initial testing threshold, and defines the objective element as the suggested lower threshold of the test device for testing the current products;

wherein the first type quantity of the current products is the quantity determined as good products by the test device, and a manual review is also good products; the second type quantity of the current products is the quantity determined as good products by the test device, and a manual review is defective products; the third type quantity of the current products is the quantity determined as defective products by the test device, and a manual review is good products; the fourth type quantity of the current products is the quantity determined as defective products by the test device, and a manual review is also defective products.

8. The device of claim 7, wherein the at least one processor is further configured to:
obtain a maximum product parameter from defective products determined by the test device when the set mode of the initial testing threshold is an upper threshold mode;
add the maximum product parameter, the initial testing threshold, and a number of values between the maximum product parameter and the initial testing threshold into a second set; and
define an element of the second set with a maximum effectiveness as a suggested upper threshold of the test device for testing the current products.

9. The device of claim 8, wherein the at least one processor defining the element of the second set with the maximum effectiveness as the suggested upper threshold of the test device for testing the current products comprises:
calculating a difference between each of a plurality of elements and the initial testing threshold when the second set comprises the plurality of elements with the maximum effectiveness;
selecting an objective element from the plurality of elements which has a minimum difference with respect to the initial testing threshold; and
defining the objective element as the suggested upper threshold of the test device for testing the current products.

10. The device of claim 7, wherein the effectiveness of the experiment threshold is calculated by a formula of: $BF=(TN'-TN)*COST1-(FN'-FN)*COST2$;
wherein BF represents the effectiveness of the experiment threshold, TN' represents the first type quantity of the current products under the experiment threshold, TN represents the first type quantity of the current products under the initial testing threshold, FN' represents the third type quantity of the current products under the experiment threshold, FN represents the third type quantity of the current products under the initial testing threshold, COST1 represents a cost of the test device to determine good products as defective products, and COST2 represents a cost of the test device to determine defective products as good products.

11. A device for setting a testing threshold of products, the device comprising:
a test device;
at least one processor communicated with the test device; and
a storage device storing one or more programs which when executed by the at least one processor, cause the at least one processor to:
obtain an initial lower threshold and an initial upper threshold set by the test device for testing current products;
obtain a first type quantity of the current products, a second type quantity of the current products, a third type quantity of the current products, and a fourth type quantity of the current products counted by the test device when the current products are tested under the initial lower threshold;
obtain a minimum product parameter from defective products determined by the test device under the initial lower threshold;
add the minimum product parameter, the initial lower threshold, and a number of values between the minimum product parameter and the initial lower threshold into a first set;
select an element from the first set as a first experiment threshold and obtain a first type quantity of the current products, a second type quantity of the current products, a third type quantity of the current products, and a fourth type quantity of the current products counted by the test device when the current products are tested under the first experiment threshold;
calculate an effectiveness of the first experiment threshold according to the first type quantity of the current products under the initial lower threshold, the third type quantity of the current products under the initial lower threshold, the first type quantity of the current products under the first experiment threshold, and the third type quantity of the current products under the first experiment threshold;
repeat one element from the first set and setting that as the first experiment threshold until the first set becomes an empty set to calculate an effectiveness of each element of the first set;
define an element of the first set with a maximum effectiveness as a suggested lower threshold of the test device for testing the current products;
obtain a first type quantity of the current products, a second type quantity of the current products, a third type quantity of the current products, and a fourth type quantity of the current products counted by the test device when the current products are tested under the initial upper threshold;
obtain a maximum product parameter from defective products determined by the test device under the initial upper threshold;
add the maximum product parameter, the initial upper threshold, and a number of values between the maximum product parameter and the initial upper threshold into a second set;
select an element from the second set as a second experiment threshold and obtain a first type quantity of the current products, a second type quantity of the current products, a third type quantity of the current products, and a fourth type quantity of the current products counted by the test device when the current products are tested under the second experiment threshold;
calculate an effectiveness of the second experiment threshold according to the first type quantity of the current products under the initial upper threshold, the third type quantity of the current products under the initial upper threshold, the first type quantity of the current products under the second experiment threshold, and the third type quantity of the current products under the second experiment threshold;
repeat one element from the second set and setting that as the second experiment threshold until the second set becomes an empty set to calculate an effectiveness of each element of the second set; and
define an element of the second set with a maximum effectiveness as a suggested upper threshold of the test device for testing the current products;
wherein when the first set comprises a plurality of elements with the maximum effectiveness, the processor calculates a difference between each of the plurality of elements and the initial lower threshold, selects an objective element from the plurality of elements which has a minimum difference with respect to the initial lower threshold, and defines the objective element as the suggested lower threshold of the test device for testing the current products;

wherein the first type quantity of the current products is the quantity determined as good products by the test device, and a manual review is also good products; the second type quantity of the current products is the quantity determined as good products by the test device, and a manual review is defective products; the third type quantity of the current products is the quantity determined as defective products by the test device, and a manual review is good products; the fourth type quantity of the current products is the quantity determined as defective products by the test device, and a manual review is also defective products.

12. The device of claim 11, wherein the at least one processor defining the element of the second set with the maximum effectiveness as the suggested upper threshold of the test device for testing the current products comprises:

calculating a difference between each of a plurality of elements and the initial upper threshold when the second set comprises the plurality of elements with the maximum effectiveness;

selecting an objective element from the plurality of elements which has a minimum difference with respect to the initial upper threshold; and defining the objective element as the suggested upper threshold of the test device for testing the current products.

* * * * *